(12) United States Patent
Chung et al.

(10) Patent No.: US 7,049,512 B1
(45) Date of Patent: May 23, 2006

(54) ELECTRONIC DEVICE FOR OUTDOOR USE

(75) Inventors: Ming-Tsai Chung, Hsinchu (TW);
Cheng-Chi Cho, Hsinchu (TW);
Yong-Jhih Su, Hsinchu (TW)

(73) Assignee: D-Link Corporation, (TW)

( * ) Notice: Subject to any disclaimer, the term of this patent is extended or adjusted under 35 U.S.C. 154(b) by 0 days.

(21) Appl. No.: 11/068,963

(22) Filed: Mar. 2, 2005

(51) Int. Cl.
*H01H 9/02* (2006.01)
(52) U.S. Cl. .......................... 174/58; 174/60; 174/135; 439/535; 220/4.02
(58) Field of Classification Search .................. 174/58, 174/60, 135, 50; 220/3.8, 3.6, 4.02; 439/535; 248/906
See application file for complete search history.

(56) References Cited

U.S. PATENT DOCUMENTS 3,834,658 A * 9/1974 Theodorides ............... 248/27.1
4,214,668 A * 7/1980 Neff et al. ................... 220/3.3

* cited by examiner

*Primary Examiner*—Dhiru R. Patel
(74) *Attorney, Agent, or Firm*—Bacon & Thomas PLLC

(57) ABSTRACT

The present invention is to provide an electronic device for outdoor use, includes a housing and at least one fastening member. The housing includes at least one groove on one outer surface thereof. Each fastening member includes at least one protrusion projected from one side thereof. The protrusion is adapted to neatly insert into the groove for securing the fastening member to the electronic device. The other side of the fastening member is extended beyond the housing such that one outer surface of the housing with the groove formed thereon is adapted to mount on and dispose parallel to a wall when the other side of the fastening member is secured onto the wall.

7 Claims, 4 Drawing Sheets

ELECTRONIC DEVICE FOR OUTDOOR USE

FIELD OF THE INVENTION

The present invention relates to wireless electronic devices and more particularly to an electronic device (e.g., WAPB (Wireless Access Point Bridge)) capable of being mounted on a wall for outdoor use.

BACKGROUND OF THE INVENTION

Network such as the Internet has known a rapid, spectacular development in recent years due to the significant advancement of technology. Network access has become a part of our daily life. For example, if a company or an individual has access to the Internet, information from millions of sources can be retrieved. Moreover, wireless Internet access is gaining popularity due to the booming of the Internet. Accordingly, wireless network devices can communicate via radio waves rather than through cables. In detail, a user can operate a wireless communication device to transmit or receive radio waves to access the Internet for retrieving information therefrom while moving in a limited range. Such wireless communication devices are called WAPBs. A WAPB is typically mounted on a wall or a flat supporting surface. In operation, a computer can have access to the Internet in a limited geographical area by communicating via radio waves. As an end, the convenience of wireless network access is obtained.

Typically, a WAPB is mounted on a wall by performing a technique as detailed below. The WAPB is enclosed in a case of rectangular body. The case is comprised of two parts in which one part is adapted to close onto the other by pivoting about a hinge interconnected both parts. An internal space is thus formed when the case is closed. At least one hole is formed at one end such that cable can be extended from the WAPB to the external for transferring data thereto or receiving data therefrom without causing interference. A plurality of lugs are formed at a periphery of the case such that the case can be secured onto a wall by hanging the lugs thereon.

A number of drawbacks are found in view of the above. These drawbacks comprise:
(1) complicated design, uneasy maintenance, bulky, and difficult of being carried and storage;
(2) difficult of being machining due to special design (i.e., special machine or molding may be involved); and
(3) excessive material, too much labor, and complicated technology involved, resulting in an increase of the manufacturing cost.

Thus, the need for improvement still exists.

SUMMARY OF THE INVENTION

After considerable research and experimentation, an electronic device for outdoor use according to the present invention having the advantages of being easy in installation, simple construction, and greatly decreased manufacturing cost has been devised so as to overcome the above drawbacks of the prior art.

It is an object of the present invention to provide an electronic device for outdoor use, comprising a housing and at least one fastening member. The housing comprises at least one groove on one outer surface thereof. Each fastening member comprises at least one protrusion projected from one side thereof. The protrusion is adapted to neatly insert into the groove for securing the fastening member to the electronic device. The other side of the fastening member is extended beyond the housing such that one outer surface of the housing with the groove formed thereon is adapted to mount on and dispose parallel to a wall when the other side of the fastening member is secured onto the wall.

The above and other objects, features and advantages of the present invention will become apparent from the following detailed description taken with the accompanying drawings.

DETAILED DESCRIPTION OF THE PREFERRED EMBODIMENTS

Figure 1:
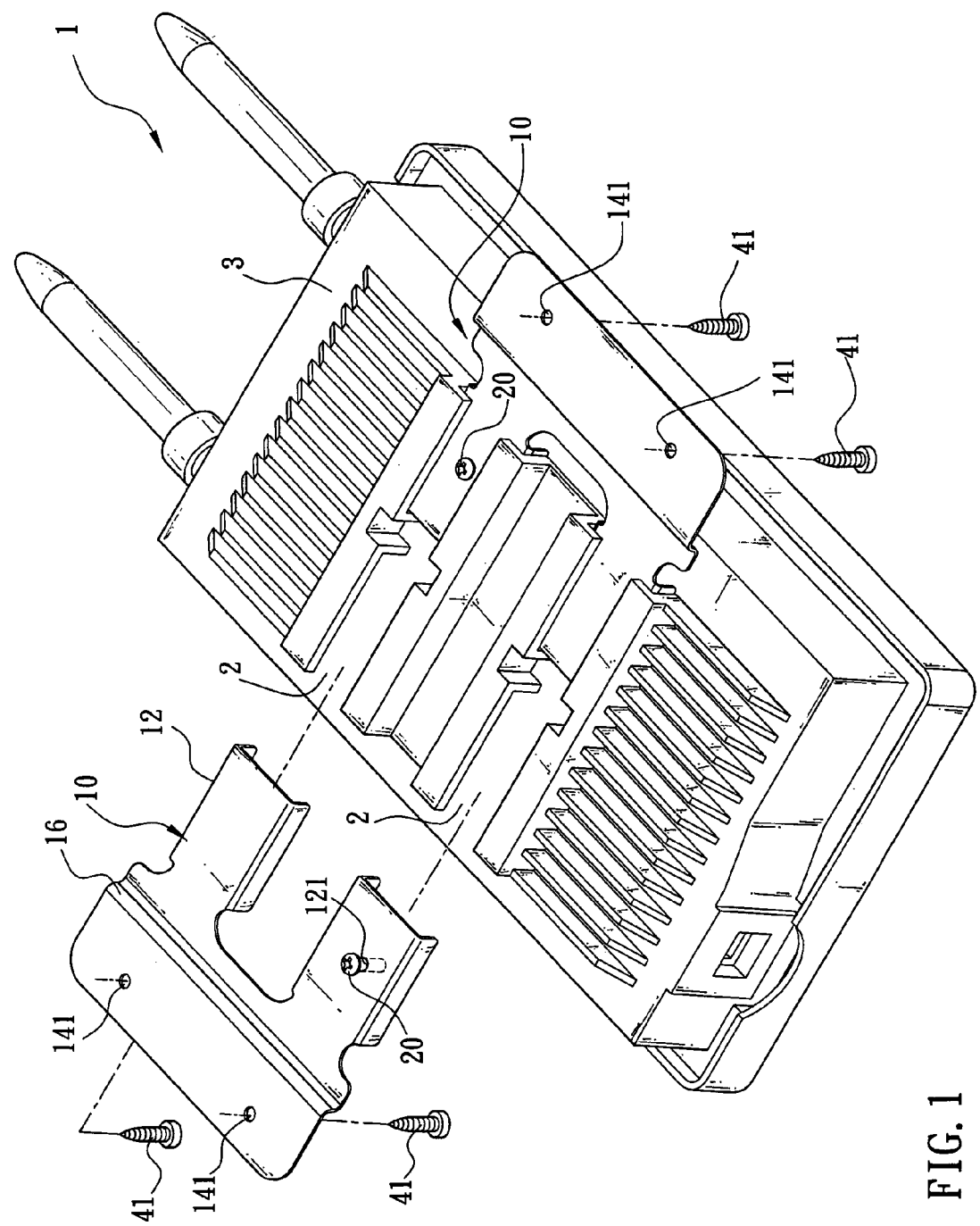
FIG. 1 is a perspective view of an electronic device for outdoor use according to the invention to be assembled with a fastening member.

Referring to FIG. 1, there is shown an electronic device 1 for outdoor use according to the invention. The electronic device 1 comprises a housing 3 and a fastening member 10. At least one groove 2 is formed on an outer surface of the housing 3 in which two parallel grooves 2 are shown. At least one protrusion 12 is projected from one side of the fastening member 10 in which two spaced, parallel protrusions 12 are shown. The fastening member 10 can be secured to the electronic device 1 when the protrusions 12 are inserted into the grooves 2. The other side of the fastening member 10 is projected from the other side of the housing 3 when the fastening member 10 and the electronic device 1 are secured together. As such, one outer surface of the housing 3 with the grooves 2 formed thereon can be mounted on a wall as detailed later.

Referring to FIG. 1 again, in the embodiment of the invention, at least one hole 121 is formed on the protrusion 12. A fastener 20 is adapted to drive through the hole 121 (i.e., the fastening member 10) for fastening the fastening member 10 onto the electronic device 1. A plurality of apertures 141 are formed on a portion proximate the other side of the fastening member 10. A plurality of fasteners 41 are adapted to drive through the apertures 141 for fastening the electronic device 1 onto a wall.

Figure 2:
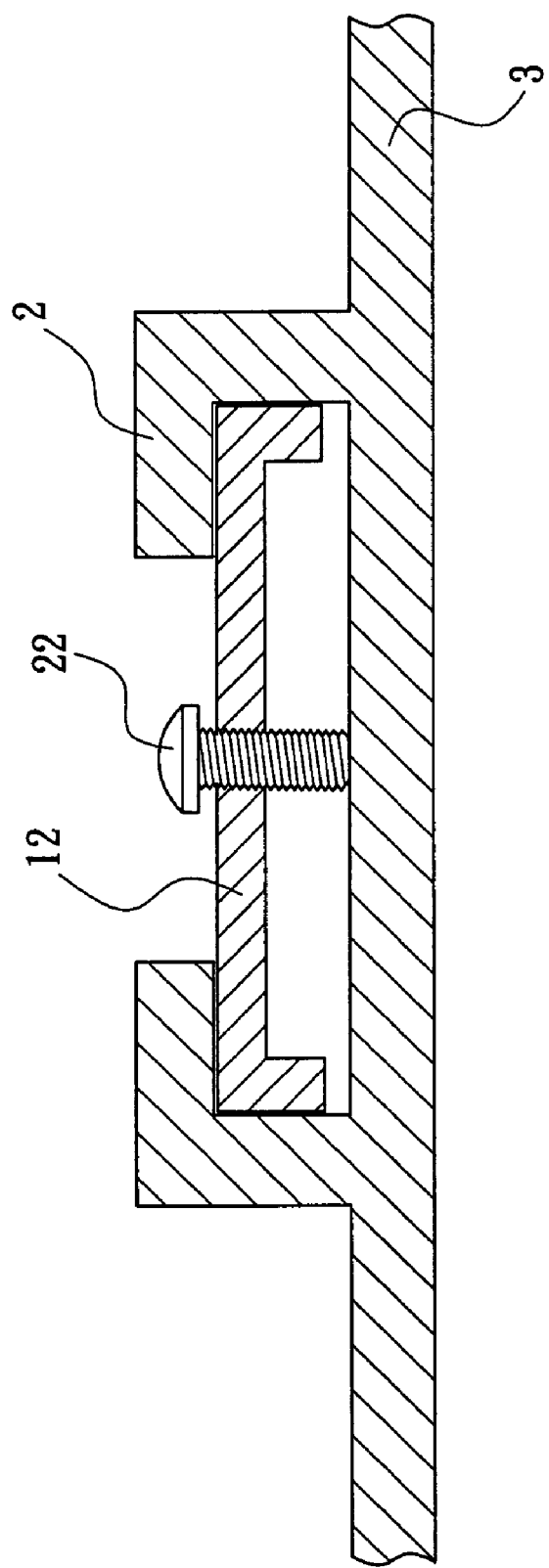
FIG. 2 is a sectional view of the protrusion inserted into the groove and fastened by the screw.

Moreover, in the embodiment of the invention shown in FIG. 2, the fastener 20 is a screw 22. The screw 22 is adapted to insert through the fastening member 10 by exerting a driving force onto its one end such that the other end of the screw 22 may exert a great force onto the housing 3 so as to fasten the housing 3 and the fastening member 10 together. As a result, the fastening member 10 is prevented from disengaging the grooves 2.

In addition, a connecting portion 16 is formed to interconnect the other side of the fastening member 10 and the protrusions 12 (see FIG. 1). The connecting portion 16 is an elongate member having a section of curve. The connecting portion 16 is provided to extend the other side of the fastening member 10 beyond the housing 3. As such, one outer surface of the housing 3 with the grooves 2 formed thereon can be mounted on the wall when the other side of the fastening member 10 is secured to the wall. Moreover, the curve section of the connecting portion 16 can increase the structural strength of the fastening member 10 to prevent deformation (i.e., the fastening member 10 is not susceptible to deformation). Referring to FIG. 2 again, in the above embodiment the protrusion 12 has a shape in cross-section of an inverted U for not only increasing the structural strength of the protrusion 12 but also saving material (i.e., no solid protrusion 12 is required). Additionally, in the above embodiment a width or height of an internal portion of the groove 2 proximate its opening at one end is larger than that at the other end of the groove 2. As such, one of a variety of protrusions 12 having a width or height other than above can be inserted into the groove 2.

Figure 3:
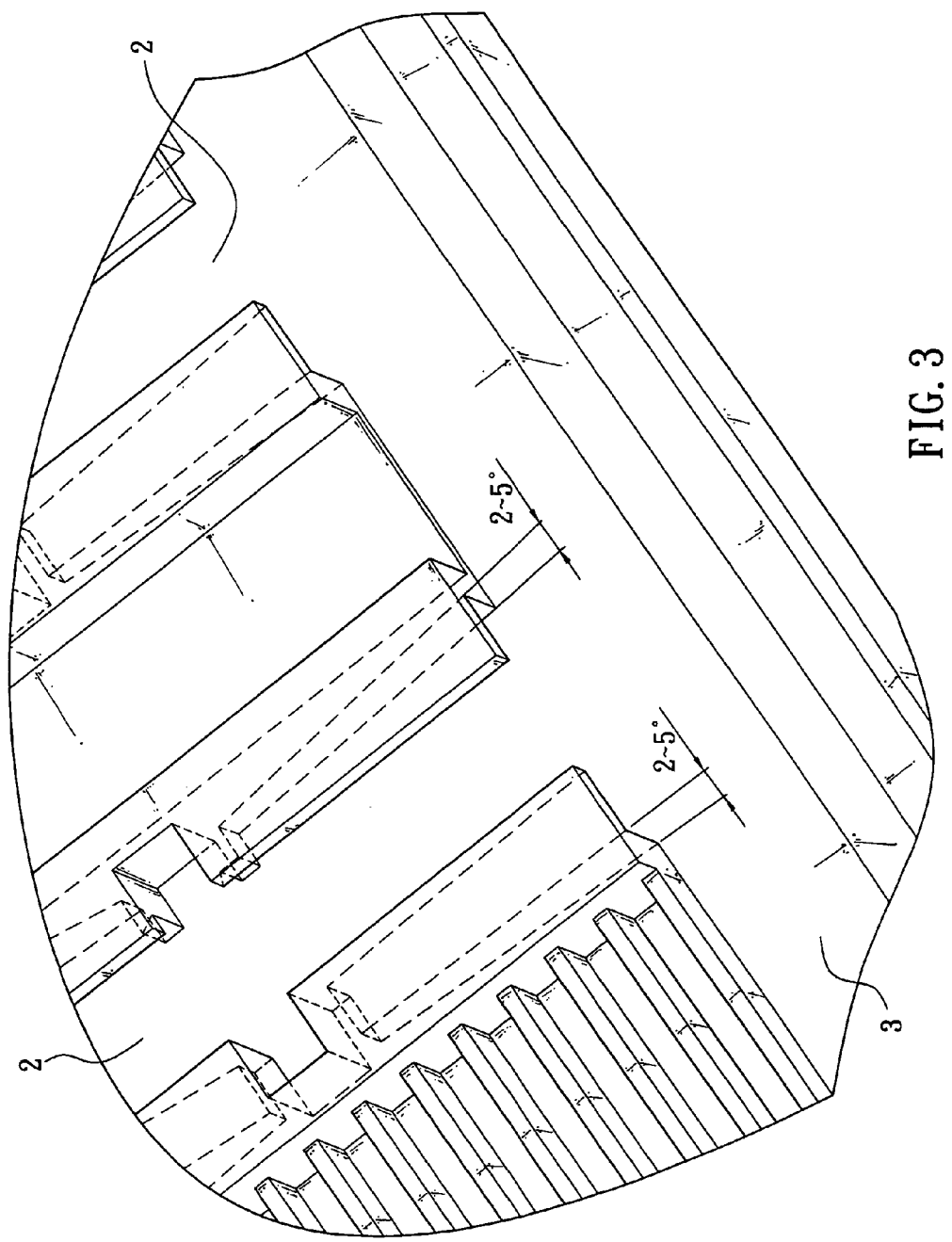
FIG. 3 is a greatly enlarged view of the groove of FIG. 1.
Figure 4:
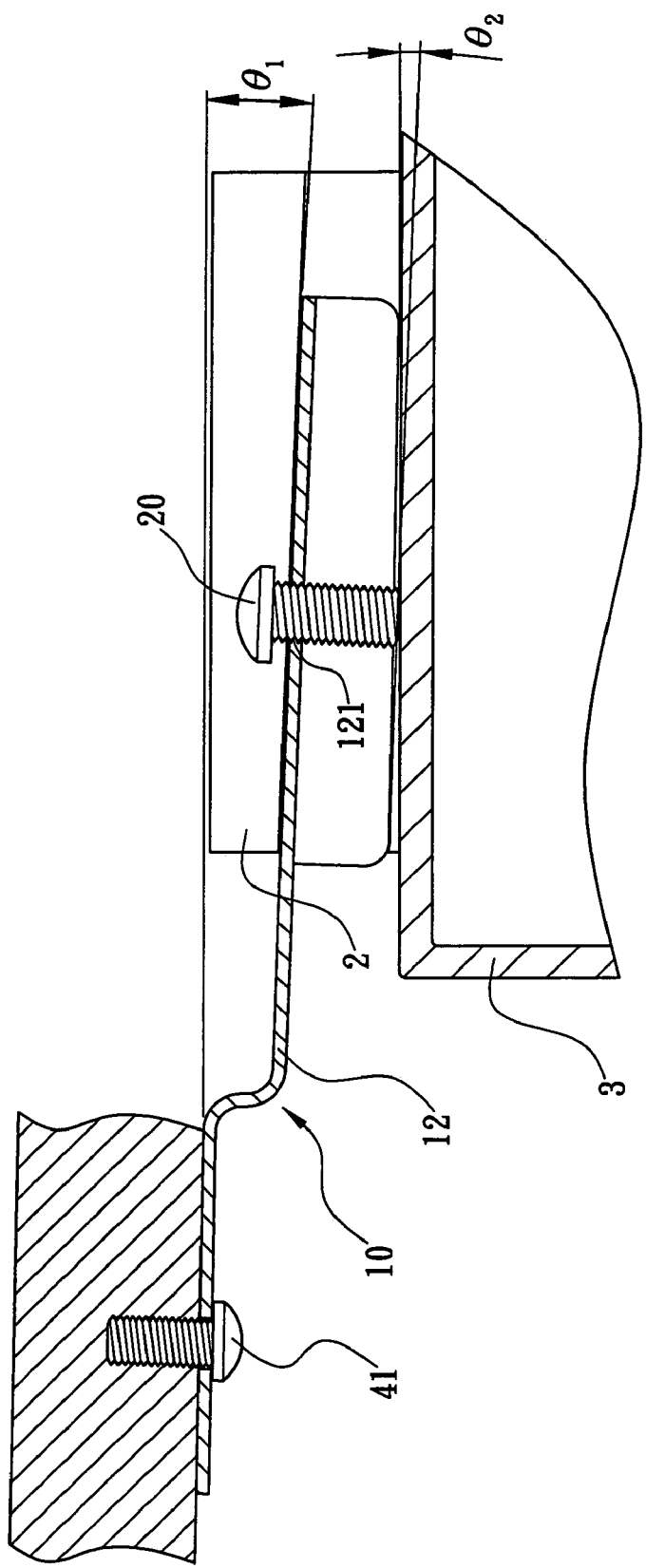
FIG. 4 is a partial, transverse, sectional view of FIG. 1 with the screws being fastened.

The grooves 2 are formed by molding. Referring to FIGS. 3 and 4, height of the opening at one end of the groove 2 is larger than that at the other end thereof due to the provision of a mold removing angle $\theta 1$ in the range of 2 to 5 degrees. Referring to FIG. 4 specifically, a gap is formed between the protrusion 12 and the groove 2 when the fastener 20 is driven through the protrusion 12 to urge against the housing 3. Thus, the hole 121 of the protrusion 12 can be formed proximate the opening of the groove 2. By utilizing the principle of lever, the surface of the protrusion 12 opposing the housing 3 may move closer to the surface of the groove 2 facing the housing 3 when the fastener 20 is driven through the fastening member 10.

A very small gap still exists between the protrusion 12 and the groove 2 due to the provision of mold removing angle $\theta 1$ at the groove 2. Thus, referring to FIG. 4 again, an oblique angle $\theta 2$ is formed between the protrusion 12 and the other side of the fastening member 10. The mold removing angle $\theta 1$ is equal to the oblique angle $\theta 2$. As such, the groove 2 is located on a horizontal surface the same as the surface of the fastening member 10 opposing the housing 3 when the protrusion 12 is inserted into the groove 2. As an end, the electronic device 1 is disposed parallel to the wall when it is fastened thereon.

In view of the above, the electronic device 1 is implemented as a WAPB. The fastening member 10 is secured to the WAPB when the fastening member 10 is inserted into the grooves 2. Also, the other side of the fastening member 10 is extended beyond the housing 3 of the WAPB. Next, fasten the WAPB onto a wall for urging the surface of the housing 3 with the grooves 2 formed thereon against the wall. As an end, the WAPB is adapted to secure to any wall in an outdoor environment, thereby performing its wireless network access capability.

While the invention herein disclosed has been described by means of specific embodiments, numerous modifications and variations could be made thereto by those skilled in the art without departing from the scope and spirit of the invention set forth in the claims.

What is claimed is:

1. An electronic device for outdoor use, comprising:
  a housing comprising at least one groove on one outer surface thereof; and
  at least one fastening member comprising at least one protrusion projected from one side thereof, the protrusion adapted to neatly insert into the groove for securing the fastening member to the electronic device wherein an other side of the fastening member opposite said protrusion is extended beyond the housing such that said outer surface of the housing with the groove formed thereon is configured and arranged to mount on and parallel to a wall when the other side of the fastening member is secured onto the wall.

2. The electronic device of claim 1, wherein the protrusion comprises at least one hole for each for enabling a fastener to drive therethrough, and wherein the fastening member further comprises a plurality of apertures located proximate the other side thereof, the apertures adapted to permit a plurality of fasteners to drive therethrough.

3. The electronic device of claim 2, wherein the fastener is a screw, the screw being adapted to insert through the fastening member by exerting a driving force onto one end of the screw such that the other end thereof is adapted to exert a force onto the housing of the electronic device for fastening the electronic device and the fastening member together.

4. The electronic device of claim 2, wherein a gap is formed between the protrusion and the groove when the fastener is driven through the protrusion to urge against the housing, and wherein the hole of the protrusion is formed proximate the opening of the groove such that an outer surface of the protrusion is adapted to urge against an inner surface of the groove.

5. The electronic device of claim 4, wherein the gap exists between the protrusion and the groove due to the provision of a mold removing angle at the groove, and wherein an oblique angle is formed between the protrusion and the other side of the fastening member, and wherein the mold removing angle is equal to the oblique angle such that the groove is adapted to locate on a surface the same as the surface of the fastening member opposing the housing when the protrusion is inserted into the groove so as to dispose the electronic device parallel to the wall and fasten the electronic device thereon.

6. The electronic device of claim 1, wherein the fastening member further comprises a connecting portion for interconnecting the other side of the fastening member and the protrusion, the connecting portion being an elongate member having a section of curve for preventing deformation.

7. The electronic device of claim 1, wherein the protrusion has a shape in cross-section of an inverted U, and wherein a width or height of a portion of the groove proximate an opening at one end is larger than that at the other end of the groove such that the groove is adapted to accommodate any one of a plurality of protrusions having a varied width or height.

* * * * *